(12) United States Patent
Cui et al.

(10) Patent No.: US 7,811,924 B2
(45) Date of Patent: Oct. 12, 2010

(54) AIR GAP FORMATION AND INTEGRATION USING A PATTERNING CAP

(75) Inventors: Zhenjiang Cui, San Jose, CA (US); Mehul Naik, San Jose, CA (US); Christopher D. Bencher, San Jose, CA (US); Kenneth MacWilliams, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/336,884

(22) Filed: Dec. 17, 2008

(65) Prior Publication Data

US 2009/0309230 A1 Dec. 17, 2009

Related U.S. Application Data

(60) Provisional application No. 61/061,964, filed on Jun. 16, 2008.

(51) Int. Cl.
*H01L 21/4763* (2006.01)
(52) U.S. Cl. .................. 438/619; 438/421; 438/422; 257/522; 257/E23.013; 257/E21.581
(58) Field of Classification Search ............... None
See application file for complete search history.

(56) References Cited

U.S. PATENT DOCUMENTS

| | | | |
|---|---|---|---|
| 5,328,810 A * | 7/1994 | Lowrey et al. | 430/313 |
| 2007/0224823 A1* | 9/2007 | Sandhu | 438/694 |
| 2009/0001045 A1* | 1/2009 | Chen et al. | 216/13 |
| 2009/0200636 A1* | 8/2009 | Edelstein et al. | 257/522 |

\* cited by examiner

*Primary Examiner*—W. David Coleman
*Assistant Examiner*—Shaka Scarlett
(74) *Attorney, Agent, or Firm*—Blakely Sokoloff Taylor & Zafman

(57) ABSTRACT

Methods for patterning films and their resulting structures. In an embodiment, an amorphous carbon mask is formed over a substrate, such as a damascene layer. A spacer layer is deposited over the amorphous carbon mask and the spacer layer is etched to form a spacer and to expose the amorphous carbon mask. The amorphous carbon mask is removed selectively to the spacer to expose the substrate layer. A gap fill layer is deposited around the spacer to cover the substrate layer but expose the spacer. The spacer is removed selectively to form a gap fill mask over the substrate. The pattern of the gap fill mask is transferred, in one implementation, into a damascene layer to remove at least a portion of an IMD and form an air gap.

18 Claims, 10 Drawing Sheets

AIR GAP FORMATION AND INTEGRATION USING A PATTERNING CAP

CROSS REFERENCE TO RELATED APPLICATIONS

This application claims the benefit of U.S. Provisional Application No. 61/061,964 filed Jun. 16, 2008, entitled AIR GAP FORMATION AND INTEGRATION USING A PATTERNING CAP.

BACKGROUND

1) Field

Embodiments of the present invention generally relate to microelectronic fabrication, and more particularly to methods of patterning films.

2) Description of Related Art

Feature scaling in integrated circuits enables more capable electronic devices. Scaling to smaller features increases densities of functional units in a given form factor as well as increasing device processing speeds. Device scaling, however, is not without issue. For example, optimizing the performance of smaller devices becomes increasingly difficult. This is particularly true for the scaling of interconnect parasitics, which becomes performance limiting as the devices are scaled to the 32 nm technology node and beyond.

Parasitic capacitances have been traditionally reduced with the adoption of lower dielectric constant materials with successive generations of interconnect technology. Beginning with silicon dioxide having a dielectric constant of about 3.9, fluorine doped glasses were adopted, then various spin-on dielectrics, followed by carbon doped silicon glasses and finally, arriving at porous carbon doped silicon glass, the current state of the art in high volume manufacturing. However, even the most advanced porous, doped glass has a dielectric constant of at least 2.3 and interconnect parasitic capacitance is still performance limiting in many of today's circuit architectures and promises to be more so in tomorrow's architecture.

In response, the industry is increasingly looking at forming macroscale voids (those significantly larger than the voids in so-called porous films), also called air gaps, as a way to decrease line-to-line capacitance and cross-talk to enable scaling down to 32 nm and beyond. While air gaps within the interconnect layers have been experimented with for a number of years, they have yet to be adopted into mainstream interconnect technology. This is due to some methods suffering from reliability issues and others suffering from poor repeatability and yield issues, while still others are simply cost prohibitive.

One of the issues facing most any air gap interconnect technique is how to remove a sacrificial inter-metal dielectric (IMD) and form a sealed void. An implementation of the methods described herein may be employed for such a purpose.

SUMMARY

Methods for patterning films and their resulting structures are described herein. In an embodiment, the method comprises forming an amorphous carbon mask over a substrate; depositing a spacer layer over the amorphous carbon mask; etching the spacer layer to form a spacer and to expose the amorphous carbon mask; removing the amorphous carbon mask selectively to the spacer to expose the substrate layer; depositing a gap fill layer around the spacer to cover the substrate layer but expose the spacer; removing the spacer selectively to the gap fill layer to form a gap fill mask over the substrate; and transferring the pattern of the gap fill mask into the substrate.

In one embodiment, this method may be implemented to form openings into substrate films have a critical dimension as small as 10 nm.

In an embodiment, the method may be implemented to form an air gap interconnect structure where the substrate comprises a passivation or "cap" layer over a damascene layer having alternating inter-metal dielectric (IMD) and metal interconnect. In such an embodiment, the amorphous carbon mask is formed over the cap layer. The pattern of the gap fill layer is transferred into the substrate by etching the cap layer selectively to the gap fill mask and then etching at least a portion of the IMD from the damascene layer selectively to the patterned cap layer to undercut the patterned cap layer. The small geometries enabled by method may then be sealed. In one embodiment the openings in the cap layer are closed by conformally depositing a dielectric to seal a void where the IMD was removed. In a further embodiment, the patterned cap layer is sealed with a layer comprising silicon carbon nitride.

In a particular embodiment, the spacer layer is silicon nitride, amorphous silicon or poly-crystalline silicon, the gap fill layer is silicon dioxide or carbon-doped silicon oxide, the cap layer is silicon carbon nitride and the IMD is amorphous carbon, carbon-doped silicon dioxide, or polymer dielectrics.

In a particular embodiment, the cap layer is etched with substantially the same etch process employed to remove the spacer selectively to the gap fill layer.

In an embodiment, etching the IMD comprises a dry etch process employing a gas, such as, but not limited to, reducing gases like hydrogen ($H_2$), ammonia ($NH_3$) or forming gas ($H_2/N_2$), hydrogenated fluorocarbons like carbon tetrafluoride ($CF_4$), and oxidizers like oxygen ($O_2$). In an alternate embodiment, etching the IMD comprises a wet etch process employing a chemistry, such as, but not limited to, hydrofluoric acid (HF) or isopropyl alcohol (IPA).

In one implementation, removing the IMD also removes the gap fill mask to expose the cap layer.

In one implementation, before sealing the void to form the air gap interconnect structure, a cap layer is conformally deposited on the sidewalls of the metal interconnect that was exposed upon removal of the IMD. The cap layer may comprise materials such as, but not limited to, silicon carbon nitride, silicon nitride, silicon carbide and titanium nitride.

In an alternate implementation, in forming the damascene layer, before a barrier layer, such as tantalum nitride (TaN), ruthenium (Ru), cobalt (Co), is deposited for the metal interconnects, a conformal dielectric liner layer is deposited on the sidewall of IMD to subsequently provide a protection layer to the interconnect when the IMD is removed to form the air gap. The protective dielectric may comprise materials, such as, but not limited to, silicon carbon nitride, silicon nitride, silicon carbide and titanium nitride. In such an embodiment, when at least a portion of the IMD is removed from the damascene layer to undercut the patterned cap layer, the IMD is etched selectively to the passivation dielectric forming a protective sidewall layer adjacent to the metal interconnect of the damascene layer.

Another embodiment provides a method for forming air gaps in a damascene layer including an inter-metal dielectric (IMD) between two metal interconnect lines, each having a line length that is significantly longer than a line width and spaced apart by about 65 nm, or less. After forming a cap layer over the damascene layer to passivate the metal interconnect lines an amorphous carbon mask is formed over the cap layer. The amorphous carbon mask defines a line with a length that is significantly longer than a width and approximately orthogonal to the length of two metal interconnect lines. Then, a spacer is formed on opposite sidewalls of the amorphous carbon mask line. The amorphous carbon mask line is removed selectively to the spacer to form a pair of spacers, each spacer with a length that is significantly longer than a width and the length approximately orthogonal to the length of the two metal interconnect lines. Then, a gap fill layer is deposited around the pair of spacers to cover the cap layer but expose the spacers and the pair of spacers is removed selectively to the gap fill layer to form a gap fill mask having a channel or trench of a length that is significantly longer than a channel width. The channel length being approximately orthogonal to the two metal interconnect lines over the substrate ensures that the channel extends over the IMD without relying on very tight overlay tolerances that would otherwise be required. The channel is etched into the cap layer to expose the IMD between the two interconnect lines and at least a portion of the IMD from between the two interconnect lines is removed, undercutting the cap layer. The channel may then be sealed with a conformal dielectric deposition.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth, such as order of operations, to provide a thorough understanding of the present invention. It will be apparent to one skilled in the art that the present invention may be practiced without these specific details. In other instances, well-known features, such as specific deposition and etching techniques, are not described in detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments. Furthermore, it is to be understood that the various exemplary embodiments shown in the Figures are merely illustrative representations and are not necessarily drawn to scale.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
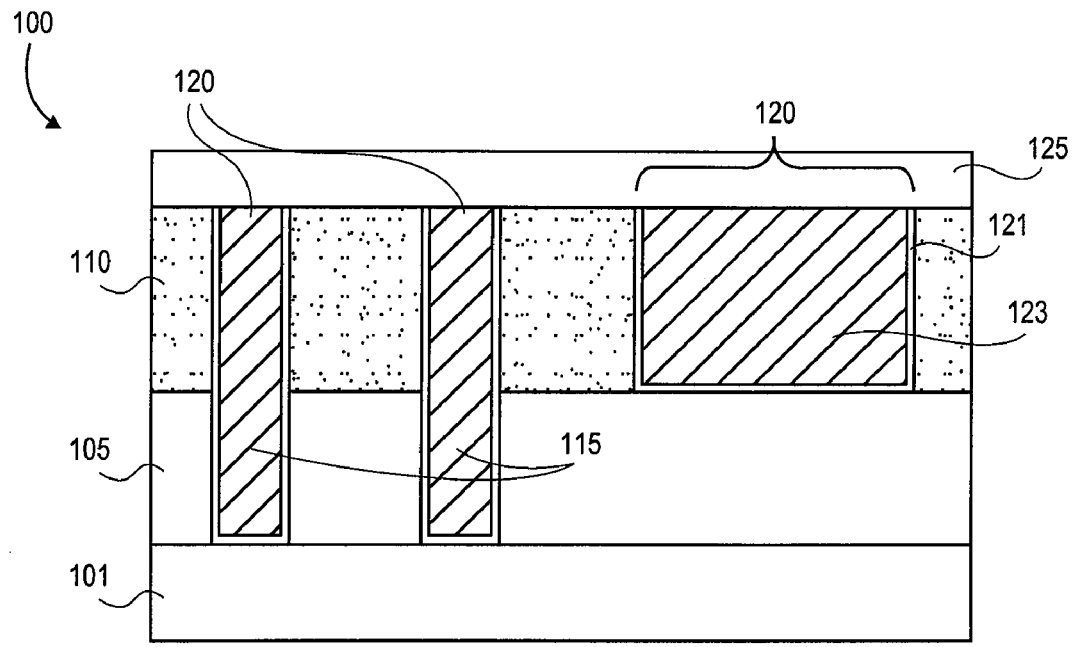
FIG. 1 is a cross-sectional view depicting a damascene structure, in accordance with an embodiment of the present invention.

FIG. 1 is a cross-sectional view depicting a damascene structure 100, in accordance with an embodiment of the present invention. Damascene structure 100 may be any damascene structure known in the art, such one comprising a damascene layer, the damascene layer including alternating inter-metal dielectric (IMD) and metal interconnect, wherein a dielectric stack is deposited, successively patterned with vias and lines, etched to form trenches and vias, filled with metal interconnect vias and wires or lines, planarized and then sealed with a cap layer.

As shown, an inter-level dielectric (ILD) 105 is formed over an underlayer 101. Underlayer 101 may be an underlying semiconductor substrate or an underlying interconnect layer. The ILD 105 may be any conventional dielectric, such as, but not limited to, silicon dioxide, amorphous carbon, such as, but not limited to, that commercially available from Applied Materials, Inc., CA, U.S.A. under the trade name Advanced Patterning Film™ (APF), carbon-doped oxides, such as Black Diamond I and Black Diamond II, both also available commercially from Applied Materials, spin-on polymer dielectrics, such as SiLK® available commercially from Dow Chemical of MI, U.S.A.

Over ILD 105 is an inter-metal dielectric (IMD) 110. The IMD 110 may be any conventional dielectric, such as those described for ILD 105. Between IMD 110 and ILD 105 may be one or more etch stop layers (not shown) useful in the formation of damascene structure 100. Extending through ILD 105 are metal vias 115, making contact to underlayer 101. Extending through IMD 110 and stopping on ILD 105 (or an interposed etch stop layer) is metal interconnect line 120.

Both the metal interconnect line 120 and the metal vias 115 may comprise a variety of materials, as known in the art. In the depicted example, a barrier layer 121, such as tantalum nitride (TaN) surrounds a fill metal 123. Fill metal 123 may be any commonly employed in the art, such as copper. Various other layers, such as seed layers, may also be included in the damascene layer.

Fill metal 123, exposed at the top of the metal interconnect line 120, is typically covered with a cap layer 125 to improve electromigration performance of the metal interconnects. In a particular embodiment, cap layer 125 is silicon carbon nitride, such as that available under the trade name of BLOk® available commercially from Applied Materials. In such an embodiment, the silicon carbon nitride cap layer may be deposited by plasma enhanced chemical vapor deposition (PECVD) to a thickness of between about 5 nm and about 50 nm, preferably between about 10 nm and about 20 nm. In alternative embodiments, cap layer 125 may be any of those materials described for ILD 105 and deposited by conventional methods to a thickness between about 10 nm and about 50 nm.

Figure 2:
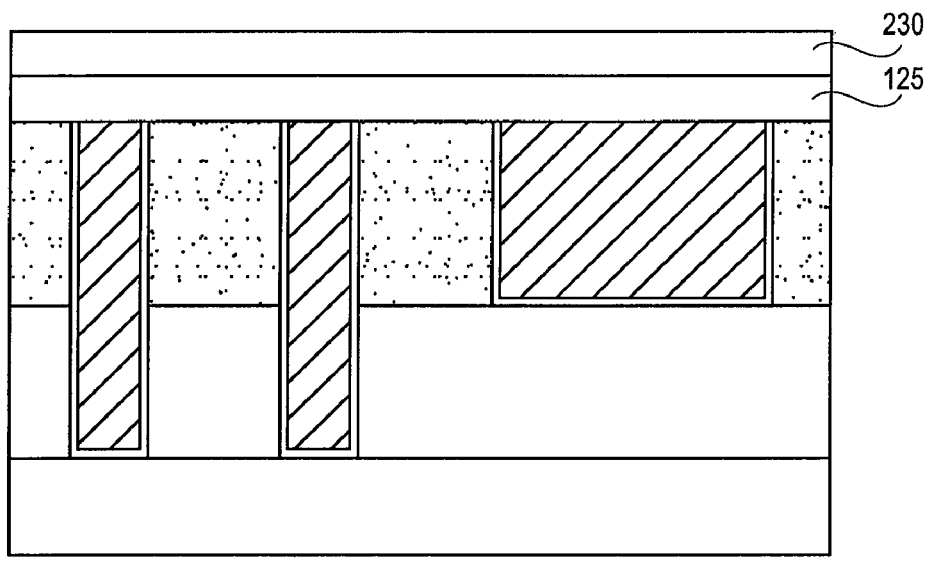
FIG. 2 illustrates a cross-sectional view representing operations in the formation of a semiconductor structure in which an amorphous carbon layer is deposited over a cap layer of the damascene substrate, in accordance with an embodiment of the present invention.

FIG. 2 illustrates a cross-sectional view representing operations in the formation of a semiconductor structure in which an amorphous carbon layer 230 is deposited over the cap layer 125 of the damascene structure 100, in accordance with an embodiment of the present invention. As used herein, amorphous carbon is a material having more than 50 atomic % carbon which, once deposited, remains stable at temperatures above 250° C. and preferably above 300° C. The resistance to high temperature allows subsequent capping layers to be deposited on the amorphous carbon layer 230 at favorable dielectric deposition temperatures of at least 250° C., discussed further below.

In one particular embodiment, the amorphous carbon layer 230 may be formed with a thermal process or a plasma enhanced process, i.e. PECVD. Generally, the CVD carbon material comprises carbon with sp1, sp2 and sp3 bonding states giving the film properties which are a hybrid of those typical of pyrolytic, graphitic, and diamond-like carbon. Because the CVD carbon material may contain a plurality of bonding states in various proportions, it lacks long rang order and so is commonly referred to as "amorphous carbon."

The amorphous carbon layer 230 is formed with a thickness dependent the material's resistance to the process used to subsequently pattern cap layer 125 and the structural integrity of the carbon material (limiting the aspect ratio of the amorphous carbon layer). In one embodiment, the amorphous carbon layer is deposited by CVD to a thickness which is approximately 5 times greater than the critical dimension of a feature to be subsequently etched into the layer for an aspect ratio of 5:1. In a further embodiment, the ratio of CVD carbon layer thickness to feature dimension is between 1:1 and 5:1. Such a range of ratios will provide adequate structural integrity so that patterned amorphous carbon features will not collapse during subsequent processing. In one such embodiment, where the minimum amorphous carbon feature dimension is to be approximately 50 nm, the thickness of the amorphous carbon layer 230 is between approximately 100 nm and approximately 500 nm. In another embodiment, where the feature dimension is approximately 25 nm, the thickness of the amorphous carbon layer is between approximately 50 nm and approximately 250 nm formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$), toluene ($C_7H_8$) and mixtures thereof. The CVD carbon material may also include nitrogen or other additives.

In alternative embodiments, a conventional dielectric layer, such as, but not limited to silicon nitride, silicon oxynitride, is employed as a hardmask in place of amorphous carbon layer 230.

Figure 3A:
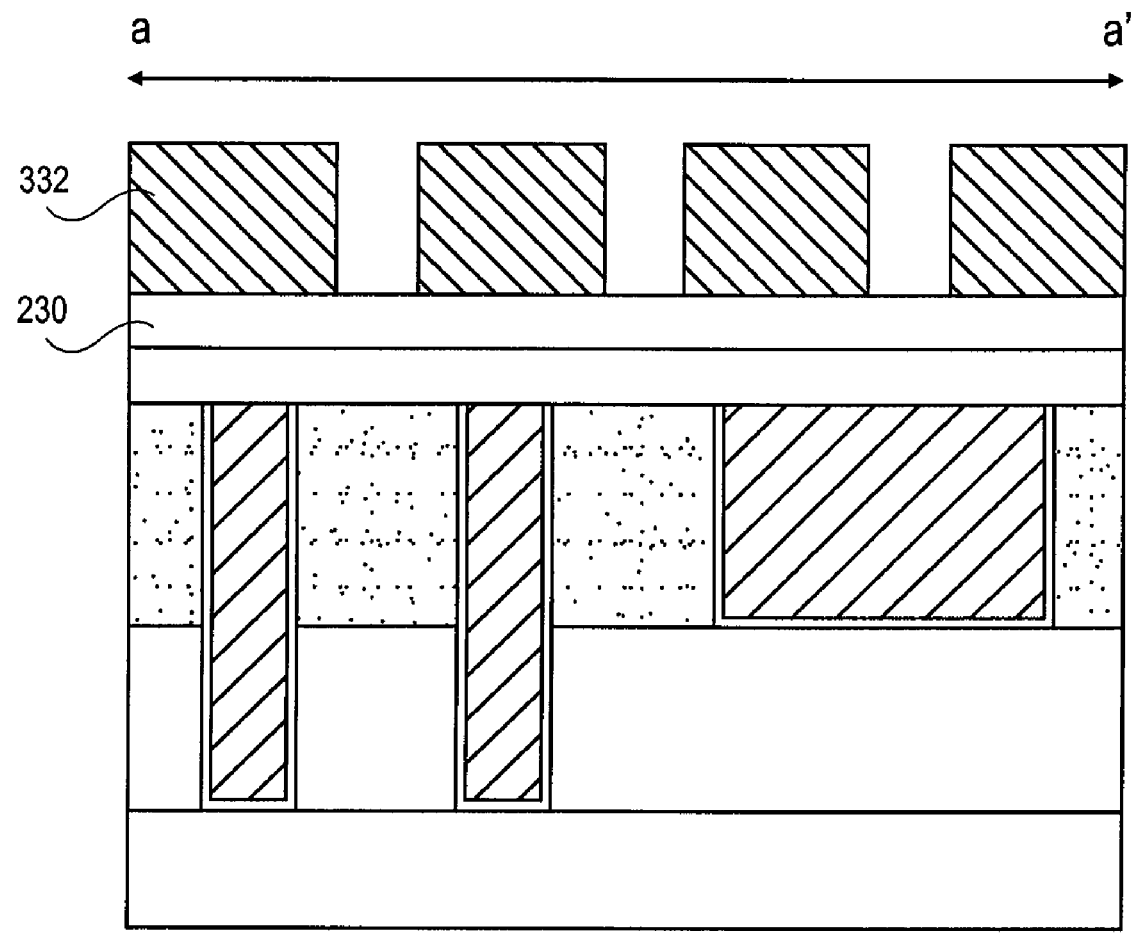
FIG. 3A illustrates a cross-sectional view representing operations in the formation of a semiconductor structure in which a patterned photo resist mask is formed over the amorphous carbon layer, in accordance with an embodiment of the present invention.

FIG. 3A illustrates a cross-sectional view representing operations in the formation of a semiconductor structure in which a patterned photo resist mask is formed over the amorphous carbon layer 230, in accordance with an embodiment of the present invention. Conventional photolithography process including, resist coat, exposure and develop may be employed. A bottom anti-reflective coating (BARC) may also be applied to the amorphous carbon layer 230 prior to the photo resist as part of the coating process. In accordance with an embodiment of the present invention, the photo resist is patterned to form photo resist mask 332 by a lithographic/development process, such as, but not limited to, 248 nm lithography/development, 193 nm lithography/development, 157 nm lithography/development, extreme ultra-violet (EUV) lithography/development and direct-write lithography/development.

Figure 3B:
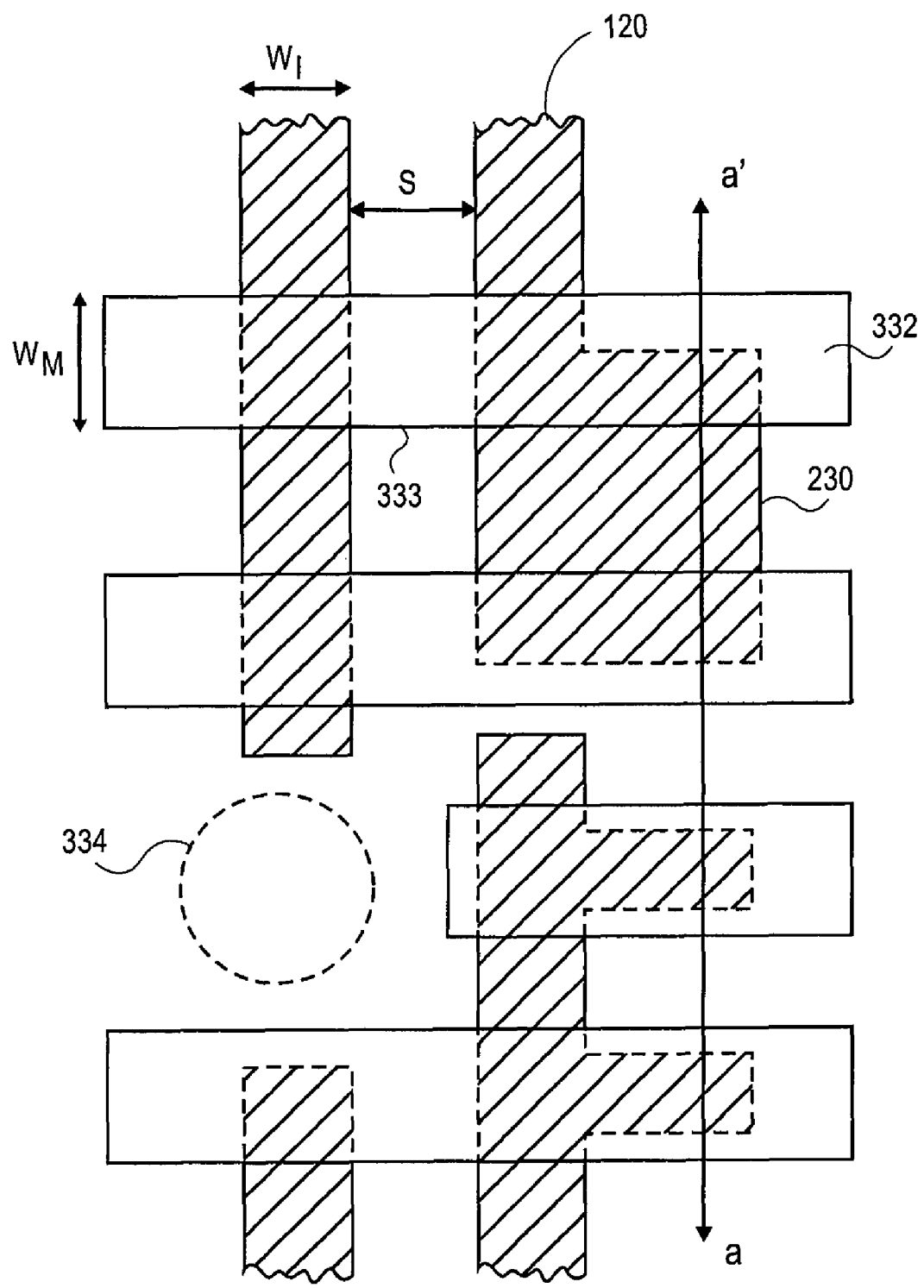
FIG. 3B illustrates a plan view showing the patterned photo resist mask provides lines over the amorphous carbon layer that overlap the metal interconnect lines of the damascene structure, in accordance with an embodiment of the present invention.

FIG. 3B illustrates a plan view showing the photo resist mask 332 providing lines over the amorphous carbon layer 230 that overlap the metal interconnect lines 120 of the damascene structure 100, in accordance with an embodiment of the present invention. The line a-a' provides reference to the cross-sectional view provided in FIG. 3A. In the embodiment depicted in FIG. 3B, metal interconnect lines 120 has a width $W_l$ that is substantially narrower than a length of the line. Similarly, photo resist mask 332 forms a line having a width $W_M$ that is substantially narrower than a length of the mask line. The line lengths of the photo resist mask 332 are approximately orthogonal to the length of the metal interconnect lines 120. Such a non-parallel arrangement between a line of the photo resist mask 332 and metal interconnect lines 120 may help to ensure an edge of the photo resist line extends over the amorphous carbon layer 230 without requiring very small overlay tolerances as would otherwise be required. For example, such a non-parallel embodiment is advantageous when metal interconnect lines 120 are closely spaced with a distance S between them. Overlaying resist mask 332 to provide an edge 333 over amorphous carbon layer 230 within the space S may be impractical unless the resist mask 332 includes lines having lengths that are non-parallel to the lengths of the metal interconnect lines 120. In a particular example, the space S between adjacent metal interconnect lines is approximately 65 nm or less and the resist mask 332 forms an edge over the amorphous carbon layer 230 above the space S. In other embodiments, however, any conventional positive or negative tone mask may be employed to form resist mask 332 into either posts or openings.

As further shown in FIG. 3B, region 334 includes no photo resist mask 332 to avoid a subsequent formation of artifacts which may cause device yield or reliability fallout. For example, regions susceptible to via misalignment or regions where a subsequent removal of a portion of the IMD from the damascene layer may case mechanical failures. Such mechanical failures may occur in region 334 having a large area devoid of metal interconnect lines 120.

Figure 4:
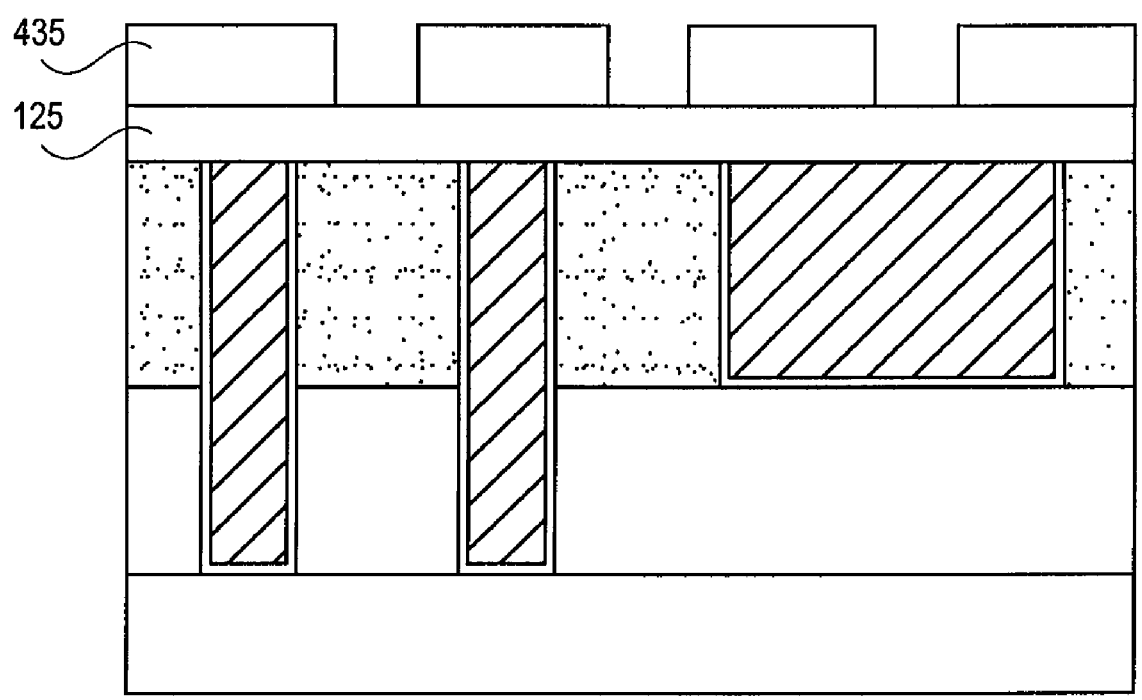
FIG. 4 illustrates a cross-sectional view representing operations in the formation of a semiconductor structure in which a patterned amorphous carbon mask is formed, in accordance with an embodiment of the present invention.

FIG. 4 illustrates a cross-sectional view representing operations in the formation of a semiconductor structure in which the amorphous carbon layer 230 is patterned into an amorphous carbon mask 435, in accordance with an embodiment of the present invention. Amorphous carbon mask 435 may be defined with an anisotropic etch to reproduce with high fidelity the pattern of the overlying photo resist mask 332. A particular embodiment provides a plasma etch process employing gases such as, but not limited to, $O_2$ and $N_2$, other nitrogen oxides and $CH_4$. In one such embodiment, etching of the amorphous carbon layer 230 to form the amorphous carbon mask 435 concurrently removes the photo resist mask 332. In one such embodiment, the thickness of the amorphous carbon layer 230 is reduced by at least 15% of the as-deposited thickness during formation of the amorphous carbon mask 435. For example, in an embodiment where an approximately 200 nm thick amorphous carbon layer 230 is deposited, an $O_2$-based plasma etch forms the amorphous carbon mask 435 while etching through photo resist mask 332 and into the amorphous carbon layer 230 by at least 30 nm to provide an amorphous carbon mask 435 with a thickness of approximately 170 nm over the cap layer 125.

Figure 5:
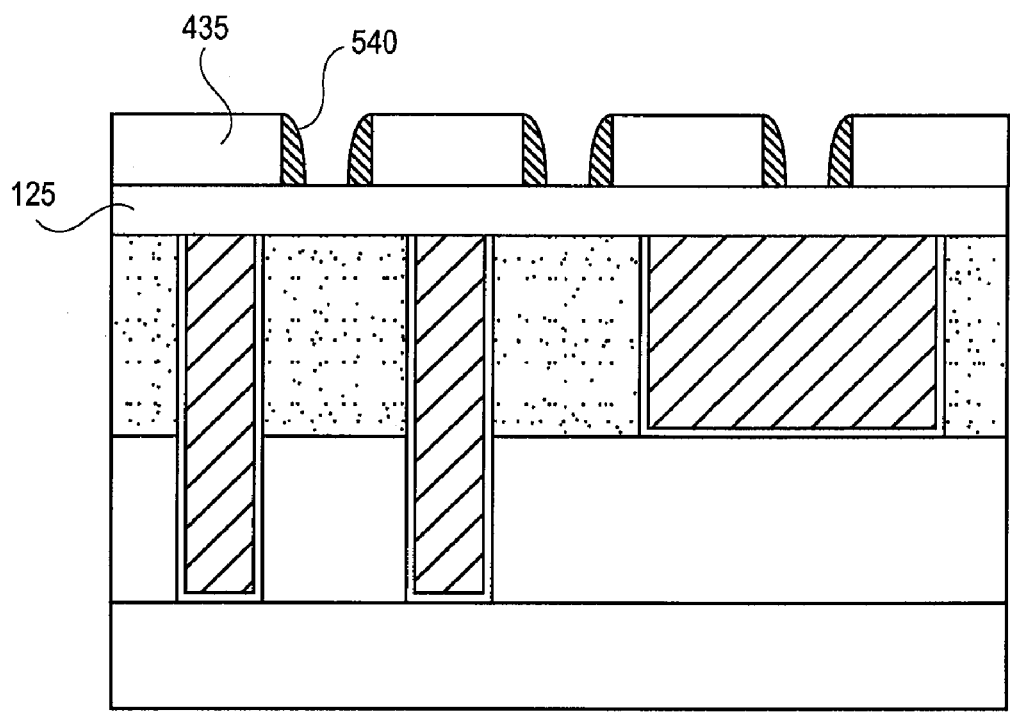
FIG. 5 illustrates a cross-sectional view representing operations in the formation of a semiconductor structure in which a spacer is formed adjacent to the sidewalls of the patterned amorphous carbon mask, in accordance with an embodiment of the present invention.

FIG. 5 illustrates a cross-sectional view representing operations in the formation of a semiconductor structure in which a spacer 540 is formed adjacent to the sidewalls of the patterned amorphous carbon mask 435, in accordance with an embodiment of the present invention. First, a spacer material layer (not shown) is deposited over and conformal with the amorphous carbon mask 435. The spacer-forming material may be any material from which both the amorphous carbon mask 435 and the cap layer 125 may be removed with acceptable selectivity. The necessary amount of selectivity is dependent on the thicknesses of the amorphous carbon mask 435 and the thickness of the cap layer 125. Generally, the thicker the amorphous carbon mask 435, the taller the spacer 540 possible, reducing the selectivity requirements between the cap layer 125 and the spacer 540. Because the amorphous carbon mask 435 is readily removed in oxidizing environ-ments, most any conventional spacer layer material, such as, but not limited to, polycrystalline silicon, amorphous silicon, polycrystalline silicon germanium, silicon dioxide, silicon carbon nitride and silicon nitride may be used. The spacer layer may be deposited by a conventional CVD or PECVD process at temperatures above about 300° C. to achieve a highly conformal and uniform depositions with appreciable rates.

The thickness of the spacer layer deposition ultimately determines the lateral thickness of the spacer 540 formed on the sidewall of the amorphous carbon mask 435 and this thickness is limited by the ability of the spacer 540 to stand freely upon subsequent removed of the amorphous carbon mask 435. The ability to stand freely is dependent on the mechanical strength of the material and stress in the film. In an embodiment, the ratio of thickness of the amorphous carbon mask 435 to the spacer layer deposition thickness is less than 10:1. In a particular embodiment, a spacer layer comprising silicon nitride is deposited to a thickness between 10 nm and 50 nm over an amorphous carbon mask 435 having a thickness between 100 nm and 500 nm.

After the spacer layer is formed, it is anisotropically etched to form the spacer 540 depicted in FIG. 5. A conventional plasma dry etch process may be employed with chemistries dependent on the spacer material chosen. In certain embodiments, a dry etch process with a gas such as, but not limited to, $C_4F_8$, $CH_2F_2$ and $CHF_3$ may be utilized.

Figure 6:
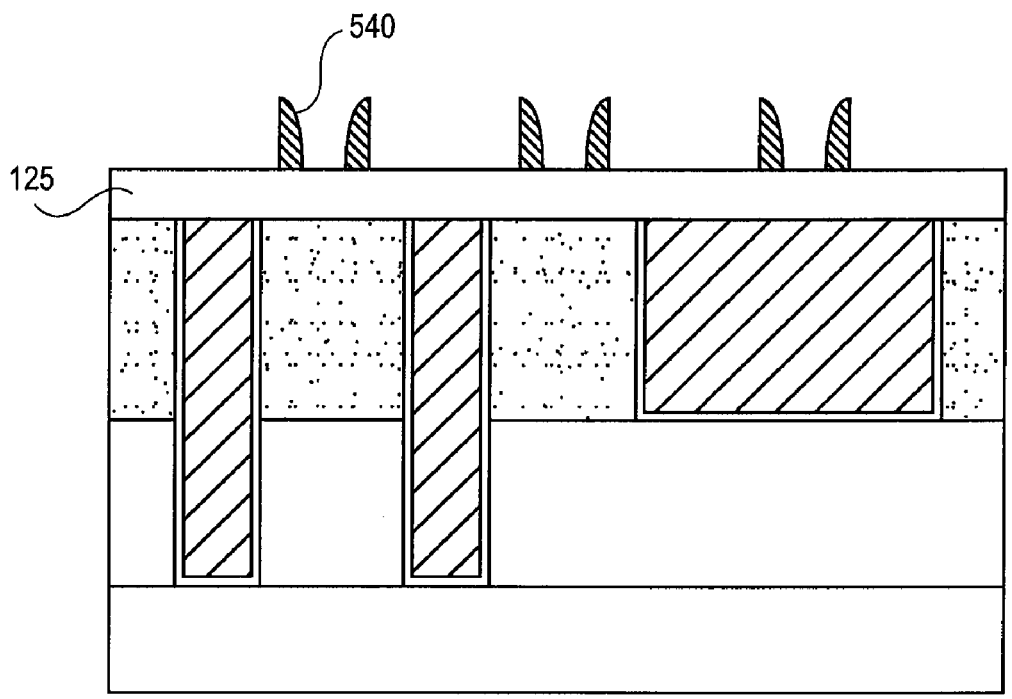
FIG. 6 illustrates a cross-sectional view representing operations in the formation of a semiconductor structure in which the patterned amorphous carbon mask is removed, in accordance with an embodiment of the present invention.

FIG. 6 illustrates a cross-sectional view representing operations in the formation of a semiconductor structure in which the amorphous carbon mask 435 is removed from the spacer 540 to expose the cap layer 125, in accordance with an embodiment of the present invention. Amorphous carbon mask 435 may be advantageously removed with the dry etch methods previously described for patterning the carbon mask layer, for example, with a plasma etch process comprising an oxidizing agent and/or a reducing agent. Because no additional mask removal operations are required, process complexity is reduced relative to the traditional hard mask process. Also, because of the mechanical fragility of the spacer 540, dry etch process embodiments advantageously avoid high surface tension wet-processing subsequent to forming the spacer 540.

Figure 7:
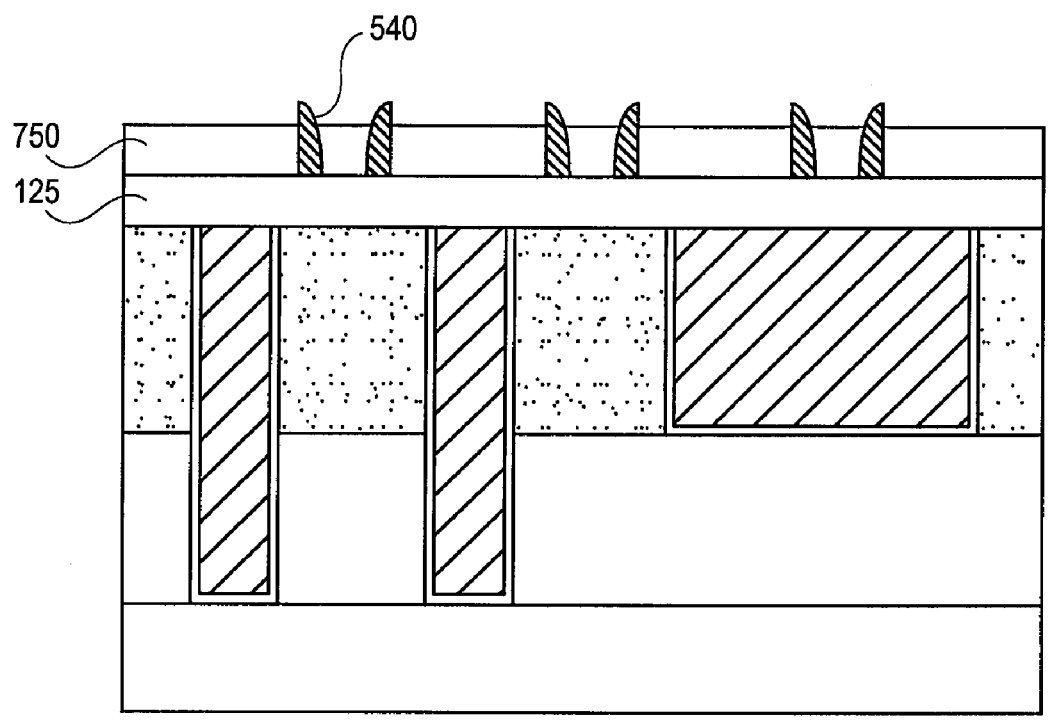
FIG. 7 illustrates a cross-sectional view representing operations in the formation of a semiconductor structure in which a gap-fill dielectric is deposited around the spacer, in accordance with an embodiment of the present invention.

FIG. 7 illustrates a cross-sectional view representing operations in the formation of a semiconductor structure in which a gap-fill layer 750 is deposited around the spacer 540, in accordance with an embodiment of the present invention. Any conventional gap-fill deposition process may be employed to deposit material over cap layer 125 and around the spacer 540. Such processes typically utilize a high density plasma (HDP) having a tuned deposition and sputter rate such that the deposition process tends to fill gaps and sputter away micro-length scale topography. HDP deposition of the material will tend to planarize the topography of the spacer 540, and in so doing, expose the spacer. As long as the deposition process is discontinued before the spacer 540 is sputtered to be planar with the gap-fill layer 750, the gap-fill layer 750 will be formed around, but not over the spacer 540. Gap-fill layer 750 may include any conventional dielectric material that can withstand a subsequent etching of the spacer 540 and cap layer 125. Thus, depending on the composition of the spacer 540 and the cap layer 125, gap-fill layer 750 may comprise silicon dioxide, silicon nitride, silicon carbon nitride, polysilicon, amorphous silicon or a low-k dielectric. In a particular implementation employing a silicon nitride spacer 540 and silicon carbon nitride cap layer 125, the gap-fill layer 750 is silicon dioxide. Silicon dioxide is advantageous both because the silicon nitride spacer 540 and the silicon carbon nitride cap layer 125 may be etched selectively to a silicon dioxide gap-fill layer 750 and also because HDP processes of silicon dioxide are well characterized.

In an alternate implementation, a non-gap-fill deposition (e.g. not HDP) or a gap-fill deposition is combined with a chemical mechanical polishing (CMP) operation, such as a conventional planarizing process employed for damascene interconnect. The polishing operation may be used to supplement or replace the gap-fill process to form gap-fill layer 750 while exposing the spacer 540. Such a polishing process, however, may be less advantageous than embodiments employing exclusively HDP gap-fill technology because of increased cost.

Figure 8:
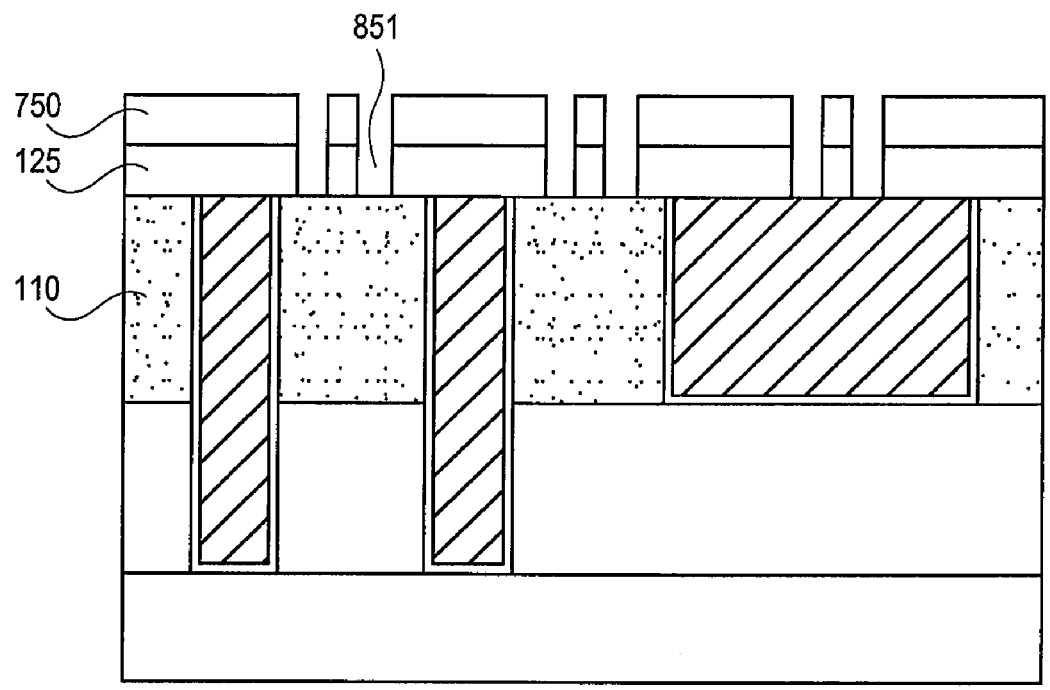
FIG. 8 illustrates a cross-sectional view representing operations in the formation of a semiconductor structure in which the spacer and cap layer are etched, in accordance with an embodiment of the present invention.

FIG. 8 illustrates a cross-sectional view representing operations in the formation of a semiconductor structure in which the spacer 540 is removed and the cap layer 125 is etched to expose the IMD 110 while the gap-fill layer 750 is an etch mask, in accordance with an embodiment of the present invention. In such embodiments where the spacer 540 forms lines with a length non-parallel to the metal interconnect lines 120, etching the cap layer 125 forms a channel 851 in the cap layer 125 with the IMD 110 exposed below the channel 851. The channel 851 is therefore also nonparallel to the metal interconnect lines 120 in certain embodiments. Removal of the spacer 540 may be performed by etching the spacer 540 selectively to the gap-fill layer 750. With proper selection of the materials for the spacer 540, the cap layer 125 and gap-fill layer 750, both the spacer 540 and cap layer 125 may be etched with sufficient selectivity to gap-fill layer 750 that at least a portion of the gap-fill layer 750 thickness remains after clearing the cap layer 125 below the spacer 540. In a particular embodiment, a dry etch process is employed to etch the spacer 540 and the cap layer 125 with successive recipe steps. In one such embodiment, where the cap layer 125 comprises silicon carbon nitride and the spacer 540 comprises silicon nitride, a dry etch process with a gas such as, but not limited to, $C_4F_8$, $CH_2F_2$ and $CHF_3$ may be utilized. Depending on the embodiment, the IMD 110 may or may not serve as an etch stop for an etch of the cap layer 125.

The IMD 110 may require an ultra-violet (UV) or electron beam treatment. In certain embodiments, these treatments of the IMD 110 are performed prior to etching the cap layer 125. In other embodiments, such a treatment may be performed after the cap layer 125 is etched.

Figure 9:
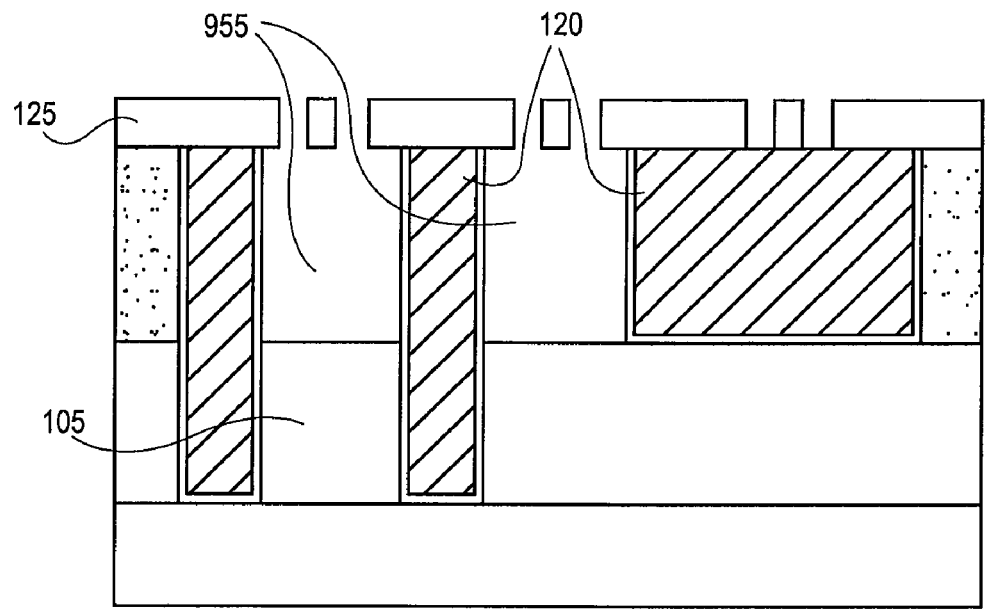
FIG. 9 illustrates a cross-sectional view representing operations in the formation of a semiconductor structure in which an inter-metal dielectric (IMD) is etched selectively to the cap layer, in accordance with an embodiment of the present invention.

FIG. 9 illustrates a cross-sectional view representing operations in the formation of a semiconductor structure in which a portion the IMD 110 is etched selectively to the cap layer 125, in accordance with an embodiment of the present invention. Removal of a portion of the IMD 110 forms an air gap 955 between metal interconnect lines 120 and enables a reduction in dielectric constant from that of the IMD 110 to that of a vacuum level achieved when the void is subsequently sealed. In a particular embodiment, the IMD 110 is removed isotropically to undercut the cap layer 125.

In a particular embodiment, a portion of the IMD 110 is removed with a dry plasma etch comprising any gas chemistry conventionally employed for isotropic etching of the particular material composition of the IMD 110. In an exemplary embodiment where the IMD 110 comprises a carbon-doped silicon dioxide (SiCOH), amorphous carbon, or a spin-on polymer dielectric, the gas chemistry may include, but is not limited to, $O_2$, $H_2$, $NH_3$ or forming gas ($H_2/N_2$). Other plasma etch embodiments, may employ conventional hydrogenated halogen gases. In still other embodiments, a wet chemical etch process may be employed to remove a portion of the IMD 110 to form the air gap 955. The wet chemistry may include, but is not limited to, hydrofluoric acid (HF) based etch chemistries, ammonia fluoride ($NH_4OH$) based chemistries, or solvent chemistries, such as isopropyl alcohol (IPA) and acetone or N-methylpyrrolidone (NMP).

In the exemplary embodiment depicted in FIG. 9, the gap-fill layer 750 is also removed by the process which etches a portion of the IMD 110. In such an embodiment, the gap-fill layer serves as a sacrificial masking layer only and the etch of the IMD 110 is masked by only the cap layer 125. Removal of the gap-fill layer 750 with the IMD 110 may be advantageous where the gap-fill layer 750 has an undesirably high dielectric constant. In a particular implementation where the gap-fill layer 750 is silicon dioxide and the IMD 110 is carbon doped silicon dioxide, a fluorocarbon-based dry plasma etch is employed with or without an oxidizer, such as $O_2$, to remove both the gap-fill layer 750 and a portion of the IMD 110 selectively to a silicon carbon nitride cap layer 125. In this implementation, the top surface of the cap layer 125 is exposed while the bottom surface of the cap layer 125 is also undercut.

In the particular embodiment depicted in FIG. 9, removal of the IMD 110 is selective to the ILD 105 or selective to a stop layer between the IMD 110 and ILD 105. For example, a stop layer of silicon nitride or silicon carbon nitride may be used to stop an etch of a doped silicon oxide IMD 110. Embodiments where the IMD 110 is etched selectively to the ILD 105 may be advantageous where the via 115 is misaligned or underlayer 101 is sensitive to the process etching ILD 105. As depicted in FIG. 9, removal of IMD 110 between metal interconnect lines 120 selectively to the ILD 105 can greatly reduce the capacitance and cross talk of the interconnect because of line lengths are much greater than the vertical distance traveled by vias 115. In alternate implementations, however, at least a portion of the ILD 105 may be etched along with the IMD 110 by an etch process that is non-selective to the ILD 105. In further embodiments, the etch of the spacer 540, gap-fill layer 750, and the IMD 110 is performed in-situ as successive steps of an etch recipe in a single chamber or a sequence of chambers in a single etch platform.

Figure 10A:
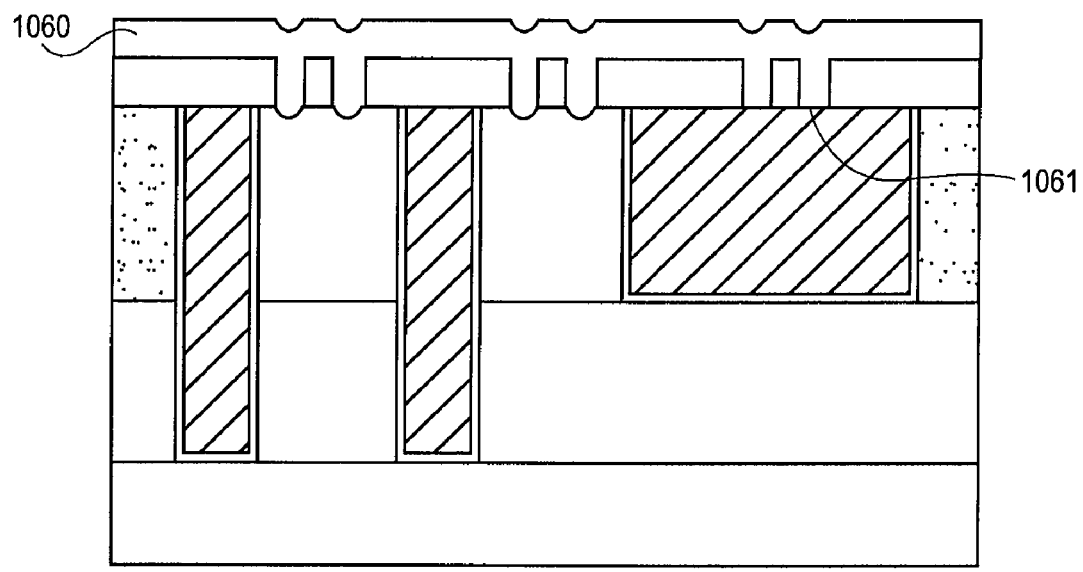
FIG. 10A illustrates a cross-sectional view representing operations in the formation of a semiconductor structure in which the cap layer is sealed, in accordance with an embodiment of the present invention.

FIG. 10A illustrates a cross-sectional view representing operations in the formation of a semiconductor structure in which the opening or channel in the cap layer 125 is sealed, in accordance with an embodiment of the present invention. Generally, the sealing cap layer 1060 should be deposited conformally to reduce the likelihood of forming a void in cap layer openings over metal interconnect lines 120, such as channel 1061. The exposed metal interconnect lines 120 should be protected by the sealing cap layer 1060 just as cap layer 125 protects other surfaces of the metal interconnect lines 120. To this end, the process of depositing sealing cap layer 1060 may further include a cleaning step whereby any oxidation or the like on the metal interconnect lines 120 exposed by channel 1061 are removed. The sealing cap layer 1060 may comprise any conventional dielectric material, such as those previously described for the cap layer 125, the IMD 110 or ILD 105. In one particular embodiment where cap layer 125 comprises silicon carbon nitride, a silicon carbon nitride sealing cap layer 1060 is deposited to reform a continuous cap layer extending over the damascene layer, protecting the metal interconnect lines 120 and sealing the openings in the cap layer 125 through which IMD 110 was removed.

Figure 10B:
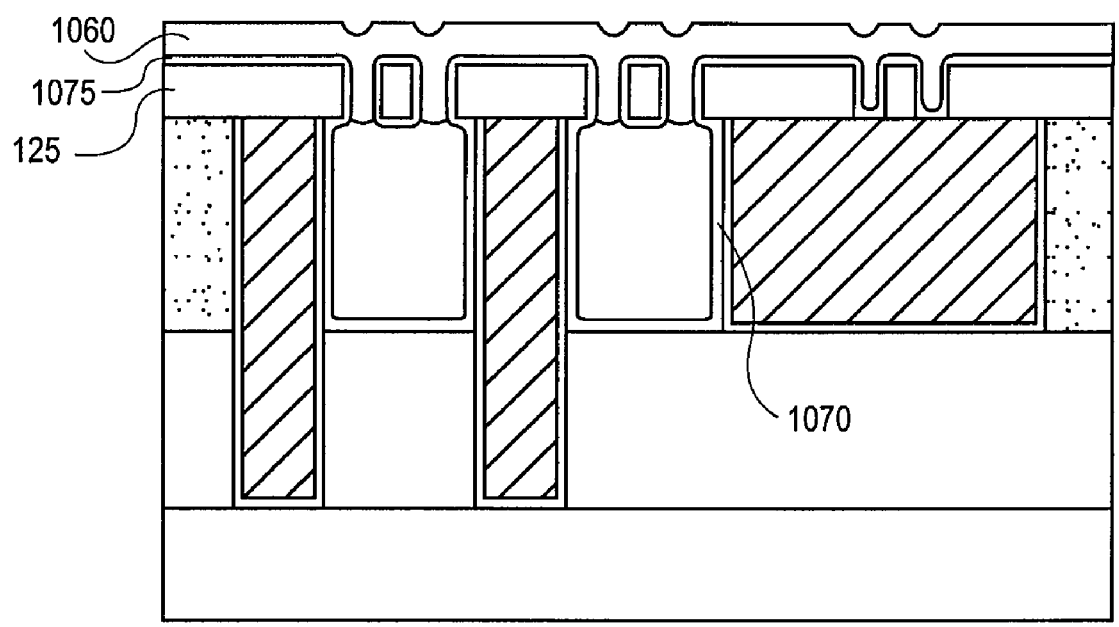
FIG. 10B illustrates a cross-sectional view representing operations in the formation of a semiconductor structure in which the metal interconnects exposed with IMD removal are passivated before the cap layer is sealed, in accordance with an embodiment of the present invention.

FIG. 10B illustrates a cross-sectional view representing operations in the formation of a semiconductor structure in which the metal interconnect lines 120 exposed upon removal of IMD 110 are passivated before the cap layer 125 is sealed, in accordance with an embodiment of the present invention. As depicted, the metal interconnect lines 120 have an exposed barrier layer 1070 after the IMD 110 is removed (shown in FIG. 9). In an embodiment, the exposed barrier layer 1070 may comprise conventional materials, such as TaN, or intermetallics based on ruthenium (Ru), cobalt (Co), etc. Such a barrier layer 1070 may benefit from an interconnect passivation layer 1075. In one embodiment, interconnect passivation layer 1075 is formed on over the barrier layer 1070 prior to sealing the cap layer 125. In one such embodiment, interconnect passivation layer 1075 is deposited with a conformal deposition process, such as atomic layer deposition (ALD) or CVD. The interconnect passivation layer 1075 may comprise any of the materials previously described for the cap layer 125, IMD 110 or ILD 105. In one particular embodiment, the interconnect passivation layer 1075 comprises silicon carbon nitride and has a thickness between 5 nm and 20 nm.

Figure 11:
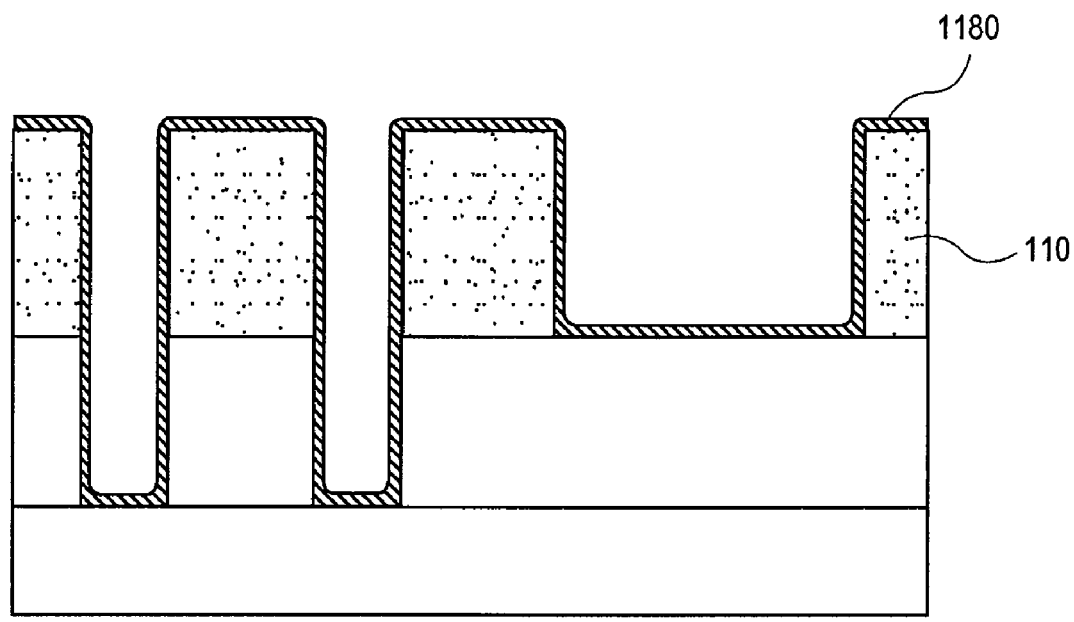
FIG. 11 illustrates a cross-sectional view representing operations in the formation of a semiconductor structure in which a dielectric liner is deposited before a barrier layer of a damascene metal interconnect is formed, in accordance with an embodiment of the present invention.

In an alternate embodiment, rather than passivating the interconnect lines after IMD 110 is removed, a liner layer is formed prior to the formation of the metal interconnect lines 120 and removal of the IMD 110 is selective to this cap layer. FIG. 11 is an alternate method of forming a damascene layer with which the present method may be incorporated. For example, FIG. 11 illustrates a cross-sectional view representing operations in the formation of a semiconductor structure in which a protective dielectric liner is deposited before a barrier layer of a damascene metal interconnect is formed, in accordance with an embodiment of the present invention. Liner layer 1180 is deposited over the IMD 110 after the formation of trenches and via openings for the damascene layer. Liner layer 1180 may be comprised of any of those material described for cap layer 125, interconnect passivation layer 1075, IMD 110 or ILD 105.

Figure 12:
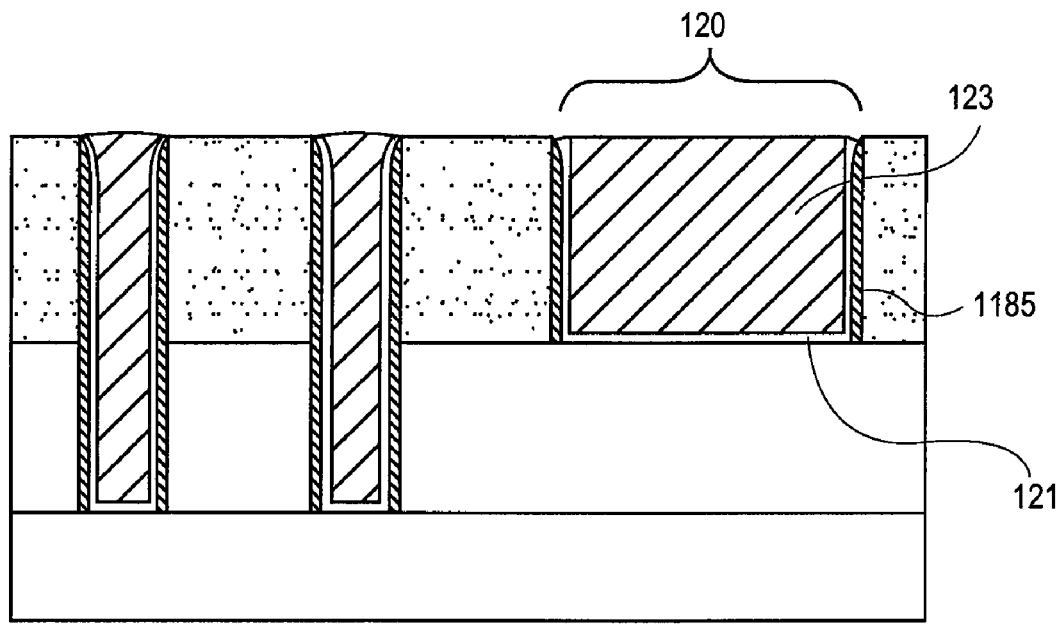
FIG. 12 illustrates a cross-sectional view representing operations in the formation of a semiconductor structure in which the dielectric liner forms spacer sidewalls adjacent to barrier layer of the damascene metal interconnect, in accordance with an embodiment of the present invention.

After the liner layer 1180 is deposited, an anisotropic etch may be performed with a dry plasma etch to form a liner spacer 1185. The dry etch may form the liner spacer 1185 selectively to the IMD 110. For example, in an embodiment with a silicon carbon nitride liner layer 1180, an etch process such as those described to form the spacer 540 may be employed. With the liner spacer 1185 formed, the damascene layer may be completed, as shown in FIG. 12. The barrier layer 121 and fill metal 123 are formed adjacent to the liner spacer 1185 to complete the metal interconnect line 120, to form a alternate damascene structure to that depicted in FIG. 1. Applying the operations described elsewhere in reference to FIGS. 2-9 forms air gap structures, as shown in FIG. 13.

Figure 13:
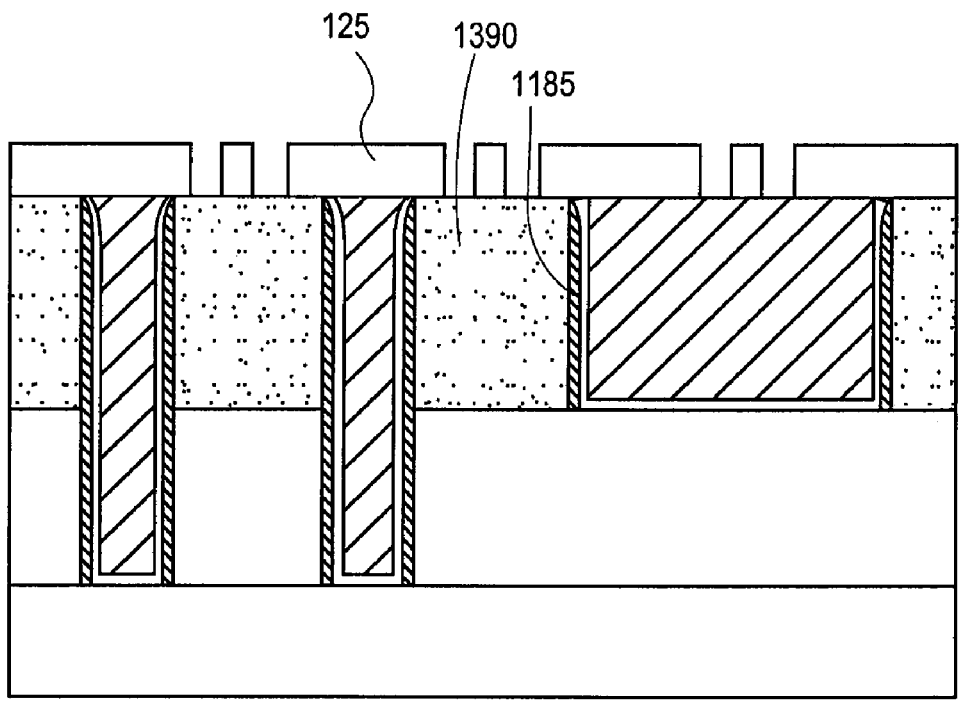
FIG. 13 illustrates a cross-sectional view representing operations in the formation of a semiconductor structure in which an inter-metal dielectric (IMD) is etched selectively to the cap layer and protective sidewalls, in accordance with an embodiment of the present invention.

FIG. 13 illustrates a cross-sectional view representing operations in the formation of a semiconductor structure in which the IMD 110 is etched selectively to the cap layer 125 and liner spacer 1185 to form air gap 1390, in accordance with an embodiment of the present invention. The liner spacer 1185 formed as part of the damascene interconnect then serves as an etch stop during the removal of the IMD 110. In a particular embodiment, both the liner spacer 1185 and the cap layer 125 comprises the same material to encapsulate three sides of the metal interconnect line 120. In a further embodiment, an etch stop layer between IMD 110 and ILD 105 (not shown) comprises the same material as liner spacer 1185 and cap layer 125 to encapsulate four sides of the metal interconnect line 120. In one such embodiment, etch stop layer between IMD 110 and ILD 105, cap layer 125 and liner spacer 1185 all comprise silicon carbon nitride.

Figure 14:
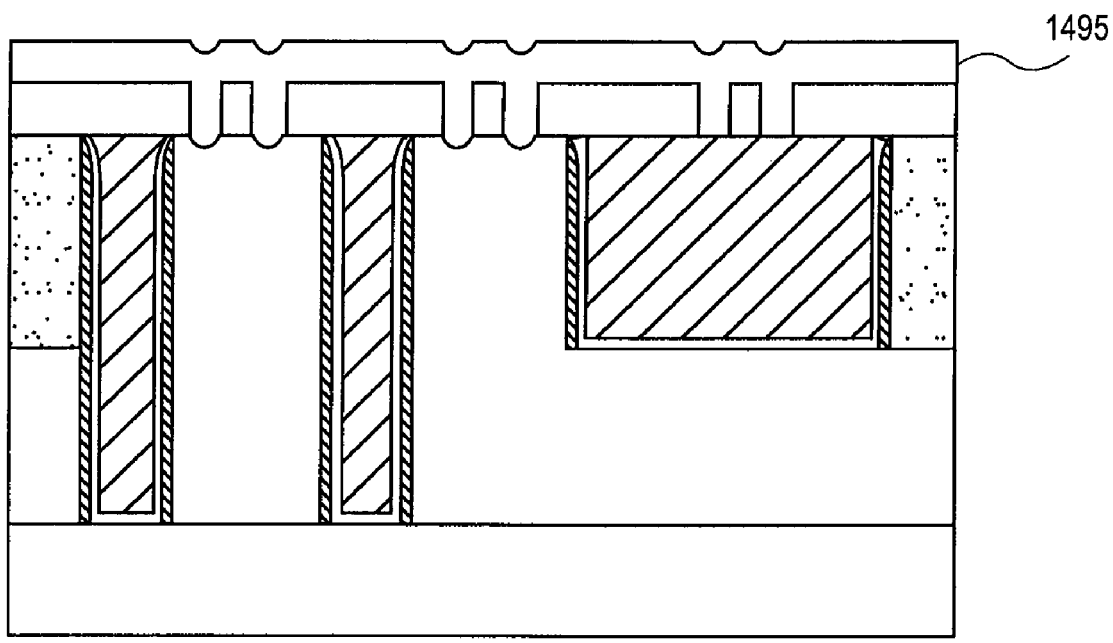
FIG. 14 illustrates a cross-sectional view representing operations in the formation of a semiconductor structure in which the cap layer is sealed, in accordance with an embodiment of the present invention.

The alternate embodiment incorporating a protective dielectric liner as part of the damascene interconnect process is then completed by sealing the channels formed in the cap layer 125. FIG. 14 illustrates a cross-sectional view representing operations in the formation of a semiconductor structure in which the cap layer 125 is sealed with a passivation sealing layer 1495, in accordance with an embodiment of the present invention. Any of the processes or materials described elsewhere in reference to FIG. 10A may be employed.

FIG. 10A and FIG. 14 mark the completion of certain exemplary interconnect air gap embodiments of the present method for patterning films. Those structures depicted may then be subjected to further processing, as known in the art.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method for patterning a film, comprising:
   forming an amorphous carbon mask over a substrate, wherein the substrate comprises a damascene layer including alternating inter-metal dielectric (IMD) and metal interconnect and a cap layer over the damascene layer;
   depositing a spacer layer over the amorphous carbon mask;
   etching the spacer layer to form a spacer and to expose the amorphous carbon mask;
   removing the amorphous carbon mask selectively to the spacer to expose the substrate layer;
   depositing a gap fill layer around the spacer to cover the substrate layer but expose the spacer;
   removing the spacer to form a gap fill mask over the substrate; and
   transferring the pattern of the gap fill mask into the substrate, wherein transferring further comprises:
   patterning the cap layer by etching a portion of the cap layer unprotected by the gap fill mask; and
   etching at least a portion of the IMD from the damascene layer.

2. The method of claim 1, wherein:
   the spacer layer comprises silicon nitride;
   the gap fill layer comprises silicon dioxide;
   the cap layer comprises silicon carbon nitride; and
   the IMD comprises at least one of: amorphous carbon, carbon-doped silicon dioxide, or polymer dielectrics.

3. The method of claim 1, wherein the cap layer is etched with substantially the same etch process employed to remove the spacer selectively to the gap fill layer.

4. The method of claim 1, wherein etching the IMD undercuts the patterned cap layer.

5. The method of claim 1, further comprising:
   conformally depositing a dielectric to close an opening in the patterned cap layer and to seal an air gap where the IMD was etched.

6. The method of claim 5, wherein the patterned cap layer is sealed with a layer comprising silicon carbon nitride.

7. The method of claim 5, further comprising:
   before sealing the air gap, conformally depositing a passivation layer on the sidewalls of the metal interconnect exposed by the IMD etching.

8. The method of claim 1, wherein etching at least a portion of the IMD from the damascene layer further comprises:
   etching the IMD selectively to a dielectric liner adjacent to a sidewall of the metal interconnect of the damascene layer.

9. The method of claim 1, wherein the metal interconnect further comprises a pair of metal lines with a space there between in which the IMD is disposed, and wherein the gap fill mask defines a pattern edge spanning the space between the pair of metal lines and extending over at least a portion of one of the metal lines.

10. The method of claim 1, wherein etching the IMD comprises dry etch process employing at least one of: hydrogen ($H_2$), ammonia ($NH_3$) or forming gas, or a wet etch process comprising hydrofluoric acid (HF) or isopropyl alcohol (IPA).

11. A method for forming air gaps in a damascene structure, comprising:
    forming a damascene layer including an inter-metal dielectric (IMD) between two metal interconnect lines, each having a line length that is significantly longer than a line width;
    forming a cap layer over the damascene layer;
    forming an amorphous carbon mask defining a line over the cap layer, the amorphous carbon mask line with a length that is significantly longer than a width and the length non-parallel to the length of the two metal interconnect lines;
    forming a spacer on opposite sidewalls of the amorphous carbon mask line;
    removing the amorphous carbon mask line selectively to the spacer to form a pair of spacers, each with a length that is significantly longer than a width and the length non-parallel to the length of the two metal interconnect lines;
    depositing a gap fill layer around the pair of spacers to cover the cap layer but expose the spacers;
    removing the pair of spacers selectively to the gap fill layer to form a gap fill mask having a channel with a length that is significantly longer than a channel width, the channel length non-parallel to the two metal interconnect lines over the substrate;
    transferring the channel into the cap layer to expose the IMD between the two interconnect lines; and
    removing at least a portion of the IMD from between the two interconnect lines, undercutting the cap layer to form the air gaps.

12. The method of claim 11, wherein the two interconnect lines are space apart by no more than 65 nm and the channel is transferred into the cap layer approximately orthogonally to a length of this space, the channel having a width between about 10 nm and about 20 nm.

13. The method of claim 11, wherein:
    the cap layer comprises silicon carbon nitride with a thickness between about 5 nm to about 50 nm;
    the spacer layer has a thickness of between 10 nm and 50 nm and comprises at least one of: silicon nitride, amorphous silicon or poly-crystalline silicon; and
    the gap fill layer comprises at least one of: silicon dioxide, or carbon-doped silicon oxide.

14. The method of claim 11, wherein the damascene layer further comprises an inter-level dielectric (ILD) layer below the IMD and removing at least a portion of the IMD also removes at least a portion of the ILD below the IMD.

15. A method for patterning a film, comprising:
    forming an amorphous carbon mask over a substrate, wherein the substrate further comprises:
        a damascene layer including alternating inter-metal dielectric (IMD) and metal interconnect; and
        a cap layer over the damascene layer and under the amorphous carbon mask;
    depositing a spacer layer over the amorphous carbon mask;
    etching the spacer layer to form a spacer and to expose the amorphous carbon mask;
    removing the amorphous carbon mask selectively to the spacer to expose the substrate layer;
    depositing a gap fill layer around the spacer to cover the substrate layer but expose the spacer;
    removing the spacer selectively to the gap fill layer to form a gap fill mask over the substrate;
    patterning the cap layer by etching the cap layer selectively to the gap fill mask; and
    etching at least a portion of the IMD from the damascene layer selectively to the patterned cap layer to undercut the patterned cap layer.

16. The method of claim 15, further comprising:
    conformally depositing a dielectric over the patterned cap layer to seal an air gap where the IMD was etched.

17. The method of claim 16, further comprising:
    before sealing the air gap, conformally depositing a passivation layer on the sidewalls of the metal interconnect exposed by the IMD etching.

18. The method of claim 15, wherein the gap fill mask defines a pattern edge spanning the IMD disposed within a space between a pair of lines in the metal interconnect, the pattern edge further extending over at least a portion of one of the pair of lines.

* * * * *